United States Patent
Hao et al.

(10) Patent No.: US 7,268,394 B2
(45) Date of Patent: Sep. 11, 2007

(54) JFET STRUCTURE FOR INTEGRATED CIRCUIT AND FABRICATION METHOD

(75) Inventors: Pinghai Hao, Plano, TX (US); Fan-Chi Hou, McKinney, TX (US); Imran Khan, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/038,562

(22) Filed: Jan. 18, 2005

(65) Prior Publication Data

US 2005/0151171 A1 Jul. 14, 2005

Related U.S. Application Data

(62) Division of application No. 10/434,642, filed on May 9, 2003, now Pat. No. 6,861,303.

(51) Int. Cl.
*H01L 29/76* (2006.01)
(52) U.S. Cl. ............ 257/341; 257/287; 257/504; 257/E27.148; 257/E29.265; 257/E21.421
(58) Field of Classification Search ......... 257/341, 257/E29.265, 287, 504, E27.148, E21.421
See application file for complete search history.

(56) References Cited

U.S. PATENT DOCUMENTS

| | | | |
|---|---|---|---|
| 4,373,253 A | 2/1983 | Khadder et al. | |
| 4,503,603 A | 3/1985 | Blossfeld | |
| 5,296,409 A * | 3/1994 | Merrill et al. | 438/189 |
| 5,618,688 A * | 4/1997 | Reuss et al. | 438/189 |
| 5,670,393 A | 9/1997 | Kapoor | |
| 5,933,733 A * | 8/1999 | Ferla et al. | 438/268 |
| 6,352,887 B1 | 3/2002 | Hutter et al. | |

* cited by examiner

*Primary Examiner*—Kenneth Parker
*Assistant Examiner*—Mohammad Timor Karimy
(74) *Attorney, Agent, or Firm*—Jacqueline J. Garner; W. James Brady, III; Frederick J. Telecky, Jr.

(57) ABSTRACT

Junction field effect transistors (JFETs) can be fabricated with an epitaxial layer that forms a sufficiently thick channel region to enable the JFET for use in high voltage applications (e.g., having a breakdown voltage greater than about 20V). Additionally or alternatively, threshold voltage (VT) implants can be introduced at one or more of the gate, source and drain regions to improve noise performance of the JFET. Additionally, fabrication of such a JFET can be facilitated forming the entire JFET structure concurrently with a CMOS fabrication process and/or with a BiCMOS fabrication process.

16 Claims, 9 Drawing Sheets

JFET STRUCTURE FOR INTEGRATED CIRCUIT AND FABRICATION METHOD

This application is a divisional of application Ser. No. 10/434,642, filed May 9, 2003, now U.S. Pat. No. 6,861,303.

TECHNICAL FIELD

The present invention relates generally to semiconductor integrated circuits and, more particularly, to Junction Field Effect Transistor structures and their fabrication.

BACKGROUND OF THE INVENTION

There are two basic types of transistors, namely Field Effect Transistors (FETs) and bipolar transistors. In general, current is conducted in FETs by charge carriers (e.g., electrons and holes) typically flowing through one type of semiconductor material, either n-type or p-type materials. In bipolar transistors, current passes in series through both n-type and p-type semiconductor materials.

Within the category of FETS, there are two basic types, namely the Metal Oxide Semiconductor (MOS) FET and the Junction FET (JFET). A primary difference between these two types of transistors is that the gate of the MOSFET has a layer of insulating material, typically referred to as gate oxide, between the gate and the other transistor electrodes. Consequently, channel current in a MOSFET is controlled by the application of electric fields across the channel to enhance and deplete the channel region, as operation requires. The gate of the JFET forms a PN junction with the other electrodes of the transistor, which can be reverse biased by the application of a predetermined gate voltage. Thus, the gate PN junction can be utilized to control the channel current by varying the extent of a depletion region to selectively dimension the current-carrying channel. JFET devices are often employed in linear IC's to provide circuits having superior performance characteristics.

Complementary Metal Oxide Semiconductor (CMOS) Integrated Circuit (IC) technology, which is utilized to form MOSFET devices, is generally the most popular integrated circuit (IC) technology. CMOS offers the advantages of a relatively inexpensive, well-defined process, low power dissipation, and transistors that can be densely packed and scaled. These features make CMOS a popular choice for very large scale integrated (VLSI) circuits. As a result, CMOS has become the industry mainstay for many types of ICs.

Bipolar devices are generally characterized fast switching speeds, durability, power controlling abilities and high power consumption. So-called "Bi-CMOS" fabrication processes have been developed in order to combine the benefits of both bipolar and CMOS transistor topologies on a single integrated circuit. Bi-CMOS processes in the past that have attempted to optimize both types of transistors have suffered from high complexity and hence often result in a much higher cost than a standard CMOS process.

There is a need for improved JFET structures and efficient methods for fabricating JFET devices.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

One aspect according to the present invention generally relates to a JFET device fabricated during a CMOS process. In essence, the JFET fabrication borrows from the CMOS process so that no additional process steps are required to implement the JFET.

Another aspect of the present invention provides a JFET that is capable of use for high voltage applications. The JFET includes an epitaxial layer that defines the JFET channel. The epitaxial layer can be grown concurrently with the collector of a bipolar transistor or with the epitaxial layer of a MOSFET device. For example, the epitaxial layer can have a thickness that enables operation at voltages that exceed about 20 V (e.g., even greater than or equal to about 30 V).

According to another aspect of the present invention, a JFET exhibits improved noise performance by implanting threshold voltage implants (e.g., VTN, VTP implants or a combination thereof) at one or more of the gate, source and drain regions. The threshold voltage implants can be introduced concurrently with threshold voltage implants of an associated CMOS or Bi-CMOS process.

Additionally or alternatively, a JFET can be fabricated with the drain, source and gate thereof to have separate moats. The moats can be defined by a field oxide formed over an epitaxial layer of the JFET. The field oxide further helps mitigate charge build up and associated hysteresis effects (e.g., walking) at p-n junctions of the JFET, which tends to occur in conventional JFET structures.

Yet another aspect of the present invention relates to a three-terminal JFET structure that includes a first gate coupled to a second gate thereof through an interconnecting isolation region having a desired conductivity (e.g., n-type, p-type), which is the same type as the gate of the JFET. Such structure can be formed concurrently or separately from a CMOS or Bi-CMOS process.

The following description and associated drawings set forth certain illustrative implementations of the invention. These implementations are indicative, however, of a few ways in which the principles of the invention can be implemented. Other advantages and novel features of the invention will become apparent from the following detailed description of the invention when considered in conjunction with the drawings.

DETAILED DESCRIPTION OF THE INVENTION

The present invention relates generally to junction field effect transistors (JFETs) and to fabrication methods for JFETs. For example, the JFET can be fabricated with an epitaxial layer that forms a sufficiently thick channel region to enable the JFET for use in high voltage applications (e.g., having a breakdown voltage greater than about 20V). Noise performance can be improved by employing threshold voltage (VT) implants at one or more of the gate, source and drain regions. Additionally, fabrication of a JFET can be facilitated by implementing all parts concurrently with a CMOS fabrication process and/or with a Bi-CMOS fabrication process. Another aspect of the present invention provides a three-terminal JFET structure, which can be fabricated individually or concurrently with a CMOS fabrication process and/or with a Bi-CMOS fabrication process.

Figure 1:
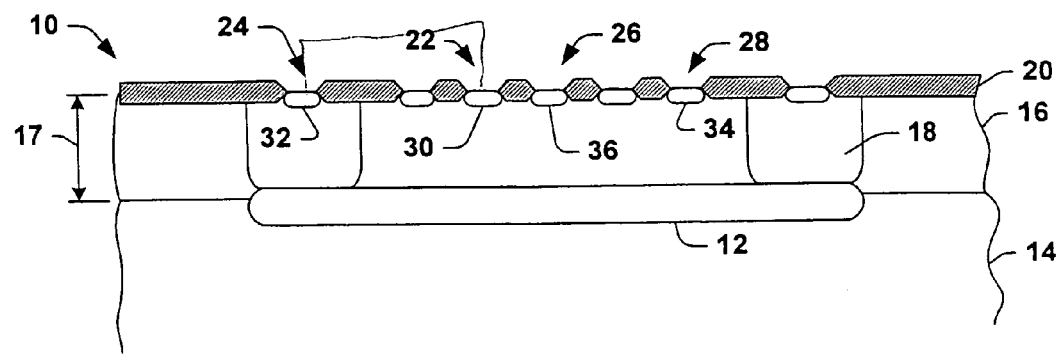
FIG. 1 is a schematic cross-sectional illustration of JFET in accordance with an aspect of the present invention.
Figure 2:
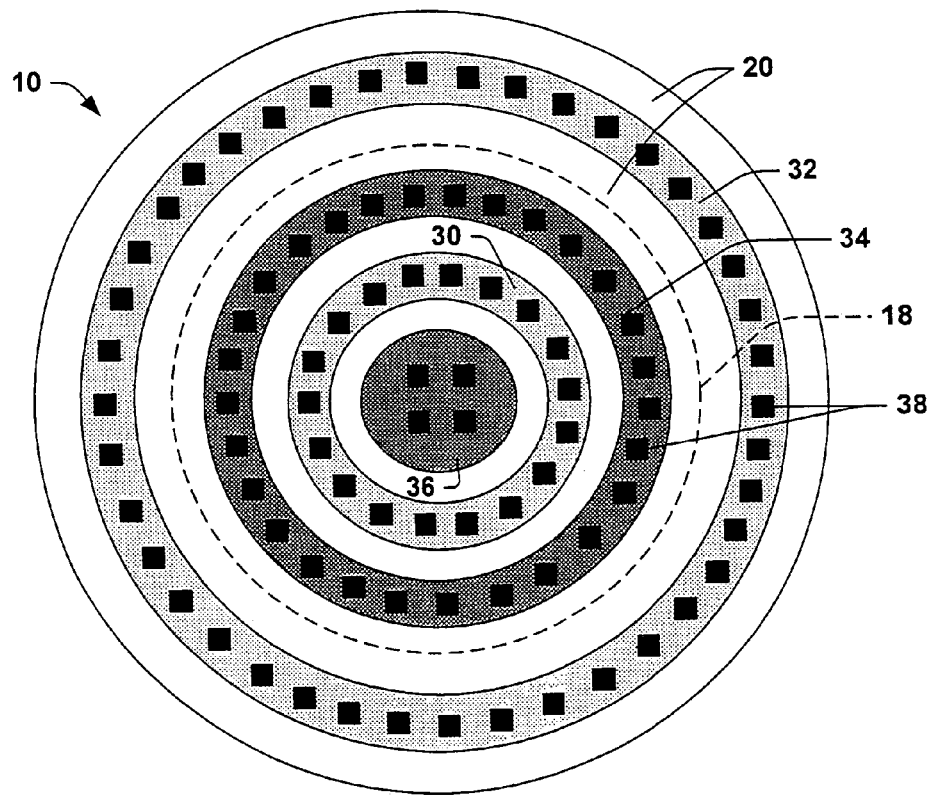
FIG. 2 depicts a plan view of a JFET after metalization in accordance with an aspect of the present invention.

FIGS. 1 and 2 illustrate a JFET 10 that can be fabricated in accordance with an aspect of the present invention. In this example, the JFET 10 is depicted as having a generally symmetrical, circular configuration. Those skilled in the art will understand and appreciate other shapes and configurations (e.g., rectangular, elliptical) that can be utilized for a JFET implemented in accordance with an aspect of the present invention.

The JFET 10 includes a buried layer 12 that provides a heavily doped region formed in a substrate 14. The buried layer 12 can be formed by implantation of a suitable type of dopant, such as a n-type or p-type dopant. For purposes of simplicity of illustration and explanation, the JFET 10 will be described as a p-type JFET (P-JFET) although those skilled in the art will understand and appreciate that n-type JFETs (N-JFETs) also can be fabricated in accordance with an aspect of the present invention.

In accordance with an aspect of the present invention, an epitaxial layer 16 is grown or deposited to have a thickness 17 that affords use of the JFET 10 in high voltage application. The epitaxial layer 16 can be formed of a suitable n-type or p-type material according to the type of substrate being used. The epitaxial layer 16, for example, has a thickness greater than about 3 μm, (e.g., approximately 3.5 μm±10%). The JFET 10 also includes an isolation region or well 18 that is formed in the epitaxial layer 16. The isolation region 18 provides a connection to the buried layer 12 through the epitaxial layer 16. The buried layer 12 defines a backgate for the JFET 10, as well as provides desired isolation for the JFET relative to surrounding circuit structures.

A field oxide layer 20 is formed at the surface of the JFET 10. The field oxide 20 is formed via patterning, etching and furnace heating to define moat (or active) regions 22, 24, 26 and 28 to facilitate formation of the respective gate, drain and source regions of the JFET 10. In this example, moat regions 22 and 24 correspond to the gate region 30 and the backgate connection region 32 of the JFET. Moat regions 28 and 26 correspond to respective source and drain regions 34 and 36. The gate region 30 and backgate connection region 32 are formed by implanting n-type or p-type dopants through a patterned mask, such as a source/drain implant mask for CMOS process. Similarly, the source and drain regions 34 and 36 are formed by implanting p-type or n-type dopants (different type of dopant from the gate and backgate formation) through a corresponding mask. The order of forming such active regions can vary as a matter of design choice. Advantageously, the moat regions 22-28 in the field oxide layer 20 operate as a hard mask to facilitate moat formation during implantation of the dopants to form the gate region 30 and backgate connection region 32 as well as the source and drain regions 34 and 36. For example, in FIG. 2, the gate 30, backgate connection 32, source 34 and drain 36 regions are depicted with respective metalization connections 38 to the respective electrodes of the JFET 10.

For the particular example of a p-type JFET, a p-type silicon substrate 14 can be utilized, and the buried layer 12 is formed of by introducing a desired concentration of a n-type dopant, such as antimony (Sb) or arsenic (As) or phosphorous (P). The buried layer 12 can be formed concurrently with the buried layer of PMOS FET device and with the same mask during a CMOS (or Bi-CMOS) process. The epitaxial layer 16 is a p-type epitaxial layer, such as having a resistivity in a range from approximately 5 to 10 ohm-cm. The epitaxial layer 16 (e.g., JFET channel region) can be formed concurrently with the epitaxial layer of the PMOS FET according to an aspect of the present invention.

By way of further example, for the P-JFET, the gate region 30 and backgate connection region 32 of the JFET 10 can be formed concurrently with introducing n-type source/drain (NSD) implants for an NMOS device. The gate region 30 and backgate connection region 32 can be formed using phosphorus (e.g., $P_{31}$) or other suitable n-type dopant. The drain and source regions 34 and 36 are formed in the epitaxial layer 16 by implanting one or more p-type dopants, which can be implemented concurrently with p-type source/drain (PSD) implants in an associated CMOS process. After forming the active regions 30-36, the gate region 30 and backgate connection region 32 can be electrically coupled together (e.g., by metalization) to make the JFET 10 a three terminal device. In accordance with an aspect of the present invention, the entire JFET 10 can be fabricated efficiently as part of a CMOS process or Bi-CMOS process without any additional process steps, generally requiring only mask modifications.

Those skilled in the art will understand and appreciate that because the field oxide 20 is provided to define separate moat regions 22-28 for each of the gate 30, source and drain regions 34 and 36, improved performance and critical dimension control can be achieved relative to conventional JFET structures. For example, the n-type and p-type implants are substantially self-aligned to the moat edges defined by the field oxide layer 20. Additionally, the n+/p– epitaxial junction is disposed under a field oxide layer, such that it is better protected. Such protection mitigates hysteresis effects (e.g., walking) in the breakdown voltage characteristics of the JFET at the respective PN junctions, such as can occur due to charge build up near the JFET surface during PN junction breakdown.

Figure 3:
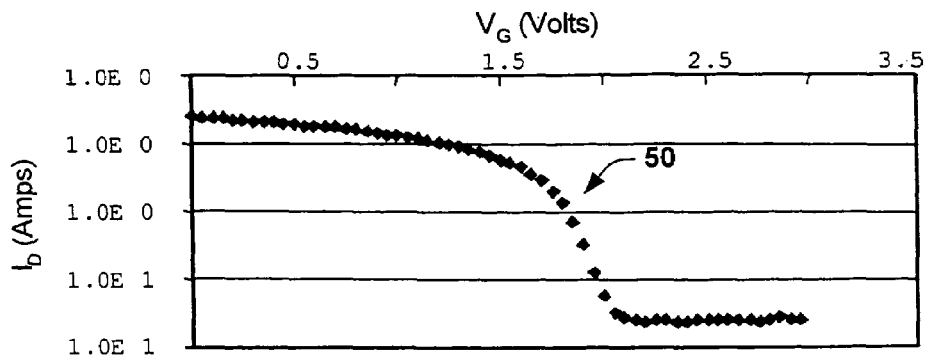
FIG. 3 is a graph depicting pinch-off voltage as a function of gate voltage for a JFET in accordance with an aspect of the present invention.

FIG. 3 is graph depicting the pinch-off voltage ($V_P$) characteristics for a p-type JFET fabricated in accordance with an aspect of the present invention. The pinch-off voltage $V_P$ characteristics are shown by plotting drain current ($I_D$) as a function of gate-source voltage ($V_G$). In this example, the pinch-off characteristics are shown for a situation in which the gate and backgate have been electrically tied together to provide a three-terminal device and a drain voltage ($V_D$) of about –5V. As pinch off occurs, the depletion region is saturated so that the current can no longer conduct except for the low level leakage in the JFET device. In this example, pinch-off occurs at around $V_P = V_G \approx 2$ V. The JFET will operate in the pinch-off region for a gate to drain voltage is greater than or equal to the pinch off voltage $V_P$, and will operate in the triode region for gate to drain voltages that is less than the pinch off voltage $V_P$. Those skilled in the art will understand and appreciate that pinch-off in an n-type device operates in a complimentary manner, saturating such that substantially no further increase in the drain current $I_D$ occurs after the pinch off region.

Figure 4:
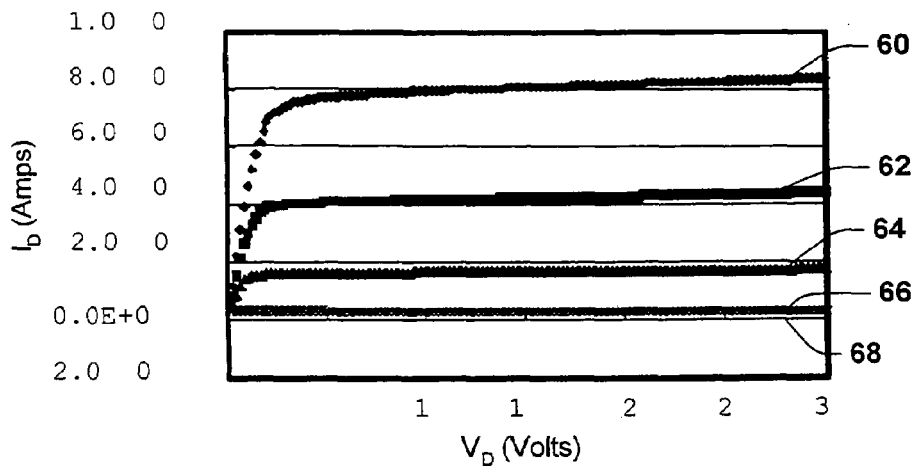
FIG. 4 is a graph depicting a family of $I_D$-$V_D$ characteristics for a JFET in accordance with an aspect of the present invention.

FIG. 4 illustrates a graph of the drain current ($I_D$) plotted as a function of the drain to source voltage for a JFET according to an aspect of the present invention. In particular, FIG. 4 depicts a family of curves 60, 62, 64, 66 and 68 for the JFET over a plurality of gate-to-source voltages. For example, the drain current $I_D$ at 60 is for gate to source voltage of about 0 V, $I_D$ at 62 is for a gate volt is of about 0.5 V, $I_D$ at 64 is for a gate to source of about 1 V volt, $I_D$ at 66 is for a gate to source of about 1.5 V and $I_D$ at 68 is for a gate to source voltage at about 2 V. As depicted in FIG. 4, those skilled in the art will appreciate that JFET provides good linear operation in the pinch off region.

Figure 5:
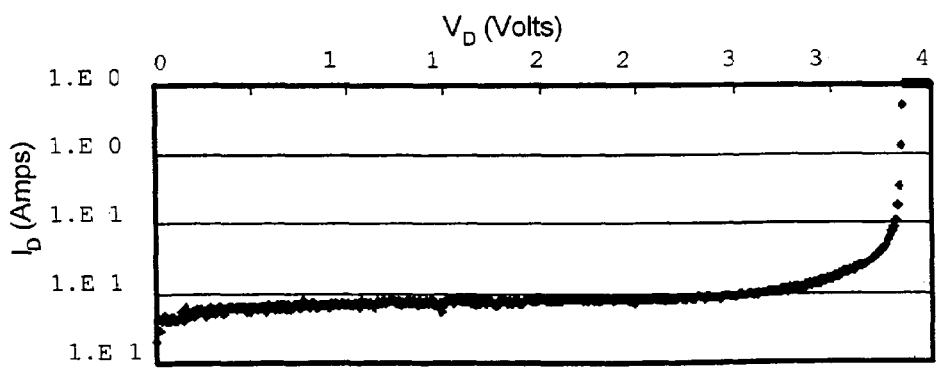
FIG. 5 is a graph depicting breakdown voltage characteristics for a JFET in accordance with an aspect of the present invention.

FIG. 5 is an example of breakdown voltage characteristics, plotting drain current $I_D$ as a function of drain voltage ($V_D$) for a p-type JFET in accordance with an aspect of the present invention. The example depicted in FIG. 5 corresponds to operation of the JFET with a gate voltage of about 3 V and in which the gate and backgate have been electrically tied together. In the example depicted in FIG. 5, break down occurs at a drain to source voltage of about –38 V, thus making the JFET useful for high voltage VLSI applications.

FIGS. 6 through 11D illustrate various parts of a process that can be utilized to fabricate a JFET in accordance with an aspect of the present invention. Those skilled in the art will understand and appreciate that many or all portions of the process can be implemented concurrently with a CMOS or Bi-CMOS process, such that no additional process is needed. For example, fabricating a JFET can employ the same implants and same masks (as modified or recreated to accommodate JFET structures) and intermediate process steps as those associated with a CMOS or a Bi-CMOS process.

While the following process steps will be described mainly with respect to forming a p-type JFET structure, those skilled in the art will understand and appreciate that an n-type JFET also could be fabricated in accordance with an aspect of the present invention.

Figure 6:
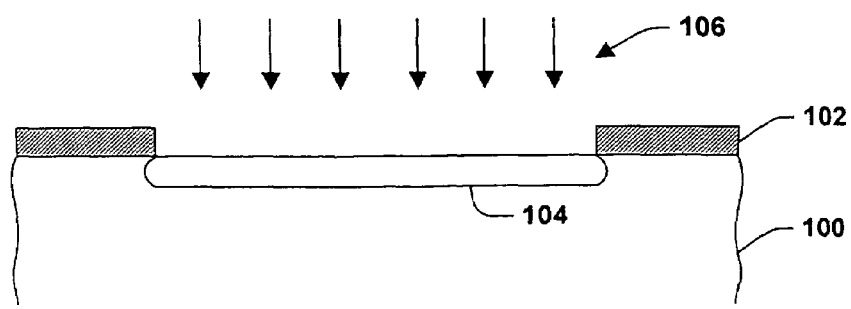
FIG. 6 is a schematic cross-sectional illustration of a substrate having a buried layer in accordance with an aspect of the present invention.

Turning to FIG. 6, the process begins by providing an appropriate substrate 100, such as silicon or other suitable material. An oxide layer 102 can be grown over the substrate and appropriately patterned using conventional photoresist processing to form a buried layer 104. For the example of a p-type JFET, the buried layer can be formed of an n-type buried layer. In particular, the n-type buried layer 104 can be formed by implanting antimony (Sb) of the dose of about 2 $E^{15}$ atoms/cm$^2$ at about 60 KeV. Those skilled in the art will understand and appreciate other n-type dopants (e.g., As, P or Sb) that can be utilized to form the buried layer 104. The formation of the buried layer 104 can be performed concurrently with the formation (e.g., patterning and implanting) of a buried layer in a PMOS device, such as part of a CMOS or Bi-CMOS process.

Figure 7:
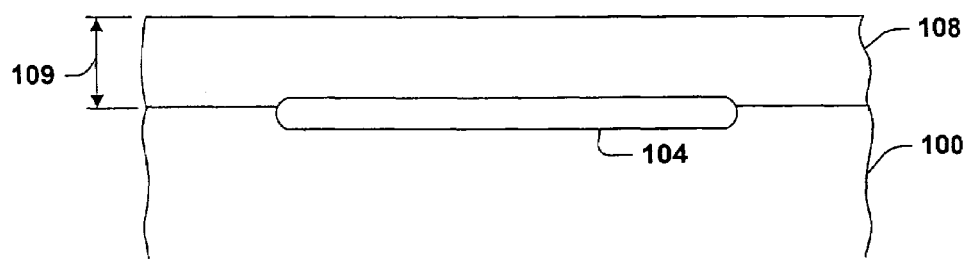
FIG. 7 is a schematic cross-sectional illustration of a substrate having an epitaxial layer in accordance with an aspect of the present invention.

In FIG. 7, an epitaxial layer 108 is formed over the buried layer 104 and the substrate 100. In accordance with an aspect of the present invention, the epitaxial layer 108 is grown to have a thickness 109 sufficient to enable the channel region of the resulting JFET to support high voltage applications, such as greater than about 20 V (e.g., about 30 V or higher. For example, the epitaxial layer 108 has a thickness 109 greater than about 3 μm (e.g., 3.5 μm±10%). The layer 108 has a resistivity of approximately 5.5 to 8.5 ohm-cm (e.g., about 7.0 ohm-cm). It is to be appreciated that the some portion of dopants in the buried layers 104 can diffuse into the epitaxial layer 108, such that the buried layer 108 could be partially in a substrate and partially in the epitaxial layer, as depicted in FIG. 7.

Continuing with the example of a p-type JFET device, the epitaxial layer 108 can be a p-type layer. For example, the epitaxial layer 108 can be formed concurrently with an epitaxial layer during a CMOS process or with the collector of an NPN bi-polar transistor as part of an integrated Bi-CMOS process. The p-type epitaxial layer, for example, can have a doping concentration of about 1 $E^{15}$ to about 1 $E^{16}$ atoms/cm$^3$ of a suitable dopant. As stated herein, by employing an epitaxial layer having such a thickness, the JFET fabricated according to an aspect of the present invention can be utilized for high voltage applications, such as greater than or equal to about 20 volts.

Figure 8:
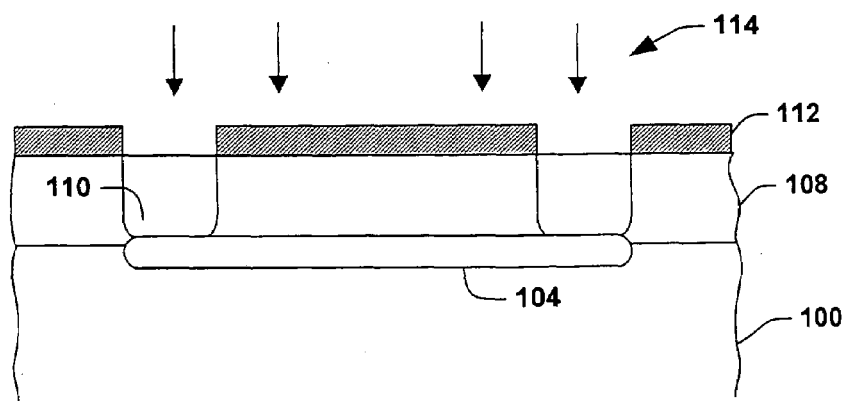
FIG. 8 is a schematic cross-sectional illustration of isolation regions formed in accordance with an aspect of the present invention.

In FIG. 8, a doped isolation region is formed 110, which can be implemented as a n-type well or a p-type well depending on the type of JFET being fabricated. The doped region 110 is formed to provide an electrical connection to the backgate of the JFET provided by the buried layer 104. The doped region 110 and the buried layer 104 thus are doped with the same type of dopants (e.g., n-type or p-type dopants). It is to be appreciated that, as used herein and the appended claims, the same type of dopant does not require use of same atomic elements or concentrations, although the same atomic elements and compounds can be used.

For a P-JFET, the doped region 110 can be formed as a n-well and as a p-well for a N-JFET. For the particular example of a P-JFET, a n-well can provide the doped region 110 can be formed by introducing a n-type dopant, such as arsenic, phosphorous or antimony. The doped region 110 also provides an isolation ring that surrounds the channel region of the JFET being fabricated. Those skilled in the art will appreciate that the isolation ring can be any shape according to a desired transistor geometry.

By way of example, the doped region 110 can be formed by depositing and pattering a layer of photoresist over an oxide mask, indicated at 112. A suitable dopant 114 is implanted through openings in the mask 112 to form the doped region 110 to define the corresponding isolation ring. After the doped region 110 has been formed, exposed portions of the resist can be removed and the wafer annealed to facilitate diffusion of the implant deeper into the epitaxial layer 108, which facilitates providing the desired connection with the buried layer 104. Advantageously, for implementation as part of a Bi-CMOS process, the n-type dopant of a P-JFET can be implanted concurrently with the dopant that forms the collector well and n-channel well of respective NPN bipolar and PMOS FET transistors.

Figure 9:
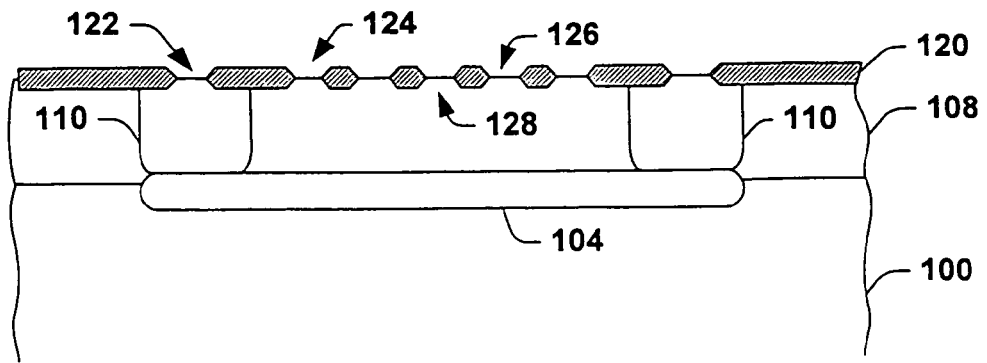
FIG. 9 is a schematic cross-sectional illustration of a field oxide layer and moat regions formed in accordance with an aspect of the present invention.

FIG. 9 illustrates formation of a field oxide layer 120 that defines moat regions 122, 124, 126 and 128. The field oxide layer 120 can be formed using local oxidation of silicon (LOCOS) or shallow trench isolation (STI) techniques, for example. By way of example, a nitride layer can be formed over an oxide layer and etched to define nitride holes or windows at field oxide regions outside moat regions 122 to 128. The resulting structure can be placed in a furnace and heated to oxidize exposed material to form the patterned field oxide layer 120. Formation of the field oxide in this manner can occur concurrently with the field oxide layer formation in an associated MOSFET or bipolar transistor.

After the moat regions 122-128 have been defined, n-type and p-type dopants can be implanted to form the gate and source/drains regions, such as to form the structure shown and described with respect to FIG. 1. The particular type of dopant to be implanted at a given region depends again on the type of JFET device being fabricated. For the example of a P-JFET, a n-type dopant can be utilized to form a JFET gate in moat region 126, which, for example, corresponds to the n-type source/drain (NSD) implant implanted concurrently in a CMOS or Bi-CMOS process, such as forming source and drain regions in a NMOS device. Additionally for a P-JFET, a p-type dopant is implanted to form the JFET source/drain regions at moat regions 124 and 128. The implantation of the p-type dopant can be implemented concurrently with the PSD implant for forming source and drain regions of a p-type CMOS device. The resulting JFET structure can be that as shown and described in FIGS. 1 and 2.

FIGS. 10A-10D illustrate alternative approaches that can be utilized to improve noise performance in a JFET fabricated in accordance with an aspect of the present invention. In particular, threshold voltage (VT) implants can be introduced at one or more of the moat regions 124, 126 and 128. As with the foregoing process steps, the VT implants can be borrowed from a corresponding CMOS process, such that no additional process steps are required. That is, with modifications to existing masks, additional VT implants can be provided (e.g., prior to forming active regions) at the moat regions 124-128, such that the resulting JFET exhibits improved noise performance.

The VT implants can be low energy implants intended to adjust the threshold voltage of associated PMOS or NMOS structures. The VT implants can be threshold voltage PMOS (VTP) implants for adjusting the threshold voltage in a PMOS transistor or threshold voltage NMOS (VTN) implants for adjusting the threshold voltage in a NMOS transistor. VTN implants typically include one or more p-type dopants and VTP implants normally comprise one or more n-type dopants; although VTP implants can include both n- and p-type dopants. The implantation of VT implant can be performed using an ion implanter that accelerates dopant ions into desired moat regions 124, 126, 128. Those skilled in the art will understand and appreciate that other dopants can be used as VT implants and that the dose and energy used during implantation of the VT implant can vary depending on the particular dopant or dopants used.

Figure 10A:
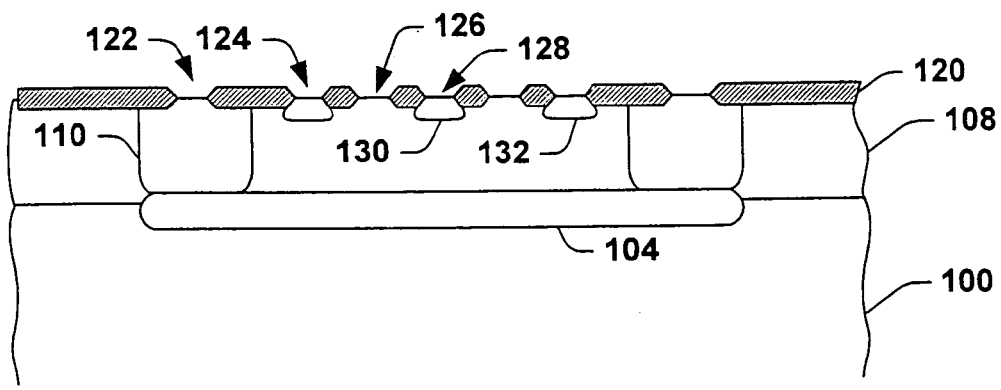
FIG. 10A is a schematic cross-sectional illustration of one or more VT implants applied in accordance with an aspect of the present invention.

In FIG. 10A, VT implants are provided at moat regions 124 and 128 corresponding to the source and drain regions of the JFET. For the example of a P-JFET, VTN implants can be utilized at the respective moats 124 and 128. The VTN implants, for example, can be provided with a suitable p-type dopant at a dosage that is less than approximately 3 $E^{13}$ atoms/cm$^2$, such as at a dosage in the range of about 1 $E^{12}$ to 3 $E^{13}$ atoms/cm$^2$. For example, the VTN implants can be provided with boron ($B_{11}$) at a dose of approximately 5 $E^{12}$ atoms/cm$^2$ at about 165 KeV, which can be followed by a low energy dose of $B_{11}$ (or other p-type dopant) of approximately 4.5 $E^{12}$ atoms/cm$^2$ at 70 KeV. A VTN implant at the moat regions 124 and 128 operates to make the source-drain junctions deeper than traditional implants alone. As described herein, this improves noise performance characteristics for the JFET.

In addition or as an alternative to the VT implants at the source and drain regions, one or more suitable VT implants can be introduced at the moat region 126. As mentioned above, moat region 126 corresponds to the region where the gate will be subsequently formed. By making the junction deeper, noise performance of the JFET can also be improved in accordance with an aspect of the present invention.

Figure 10B:
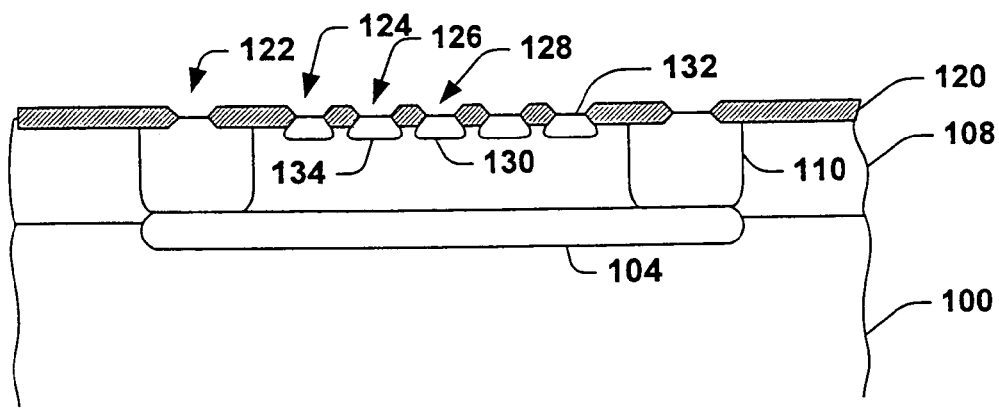
FIG. 10B is a schematic cross-sectional illustration of plural VT implants applied in accordance with an aspect of the present invention.

In FIG. 10B, the illustrated intermediate structure includes VT implants introduced at the moat regions 124 and 128 as well as at the moat region 126. For the example of a P-JFET device, one or more VTP implants are provided at the moat region 126 (subsequently to be doped with n-type dopants to form the gate) and one or more VTN implants are provided to corresponding moat regions 124 and 128 at which the source and drain will be subsequently formed.

By way of example, VTP can be provided by implanting n-type dopants at a dosage less than about 3 $E^{13}$ atoms/cm$^2$. In one particular example, the VTP implants can be provided with phosphorous ($P_{31}$) at a dose of about 4.5 $E^{12}$ atoms/cm$^2$ at about 180 KeV, which can be followed by a dose of boron fluoride ($BF_2$) of approximately 3.7 $E^{12}$ atoms/cm$^2$ at about 80 KeV. The two step VTP implants are utilized for buried channel PMOS VT adjustment. The VTN implant at moat regions 124 and 128 can be substantially as shown and described with respect to FIG. 10A.

Those skilled in the art will understand and appreciate other VTN or VTP implants or combinations of various implants that can be utilized in accordance with an aspect of the present invention.

As alternative to providing the VTN and/or VTP implants across the entire moat regions 124, 126 and 128, partial VTN and/or partial VTP implants can be utilized in accordance with an aspect of the present invention. The partial implants are applied through a mask (not shown) patterned to define selected areas of one or more moat regions at which the implants can be introduced. For example, a partial VT implant can be selectively introduced near the perimeter portions (e.g., inner and/or outer perimeter portions) of one or more moat regions. Another alternative contemplated herein is that the partial VT implants could be provided in varying concentrations across a given implantation region (e.g., a gradient of VT implant having a greater concentration at one location than at another spaced apart contiguous region).

Figure 10C:
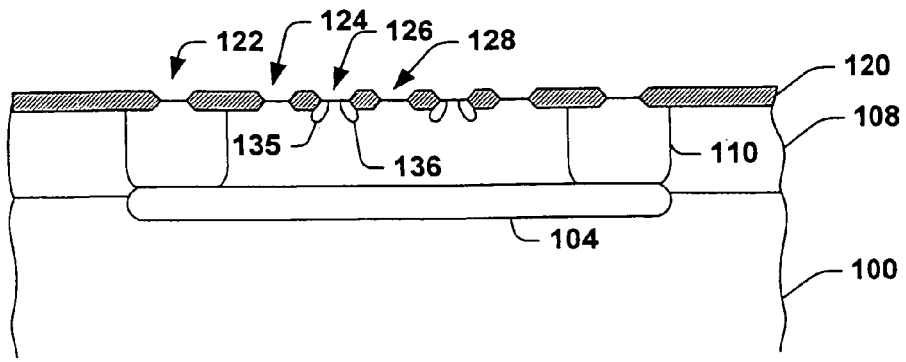
FIG. 10C is a schematic cross-sectional illustration of partial VT implants applied at the gate region in accordance with an aspect of the present invention.

In the example of FIG. 10C, partial VT implants 135 and 136 have been introduced at the moat region 126. As depicted, the partial VT implant has been applied at opposite perimeter portions of the moat region 126, namely implant 135 has been introduced proximal the source and implant 136 proximal the drain. In general, the VT implant at the moat region 126 to help push carriers away from damaged regions caused by subsequent gate formation. For example, for a P-JFET device VTP implants, such as described herein, can be utilized at the gate region provided by moat region 126. Those skilled in the art will understand and appreciate that the size and depth of the partial implant can be controlled for a given application, such as according to a CMOS fabrication process for which the VT implants are being concurrently introduced. Additionally, partial implants at different regions can be formed as having the same or different size and/or to different depths, such as by appropriately configuring the implant masks.

Figure 10D:
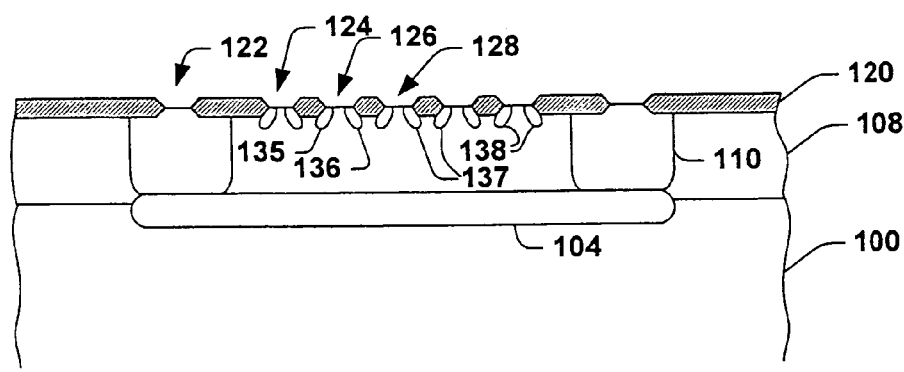
FIG. 10D is a schematic cross-sectional illustration of partial VT implants applied at source/drain regions in accordance with an aspect of the present invention.

As shown in FIG. 10D, partial VT implants also can be supplied to the one or both of moat regions 124 and 128. In the particular example of FIG. 10D, partial implants 137 are introduced at moat region 128 corresponding to the drain region, such as near inner and outer perimeter portions thereof (e.g., proximal the moat regions 122 and 126). Additionally, partial implants 138 have been introduced at moat region 124 corresponding to the source region (e.g., proximal the gate moat region 126). The VT implants at the moat regions 124 and 128 (corresponding to the source and drain regions) operate to make the source/drain junctions deeper. For the example of a P-JFET, the VT implants at moat regions 124 and 128 are p-type materials, such as any known VTN implant, which can be implanted concurrently with VTN implants in a CMOS or Bi-CMOS process.

Also depicted in FIG. 10D are partial implants 135 and 136 at the moat region 126 corresponding to the gate region. Those skilled in the art will appreciate that the partial VT implants at the moat regions 126, 124 and/or 128 (e.g., corresponding to gate, source and/or drain) can be achieved by appropriate modifications to existing VT implant mask structures of a CMOS process with no additional process requirements.

FIGS. 11A through 11D illustrate alternative implementations of JFET structures that can be fabricated according to various aspects of the present invention. The examples in FIGS. 11A-11D include various configurations of VT implants, which examples are representative not exhaustive of types of configurations that can be implemented according to the present invention. Those skilled in the art will appreciate various dopants that can be employed as VT implants for the JFET being formed, which implants can be any n-type and p-type materials borrowed from use in a corresponding CMOS or Bi-CMOS process. Thus, those skilled in the art may appreciate other combinations or configurations of JFET structures that can be fabricated, all of which are contemplated as falling within the scope of the appended claims.

Figure 11A:
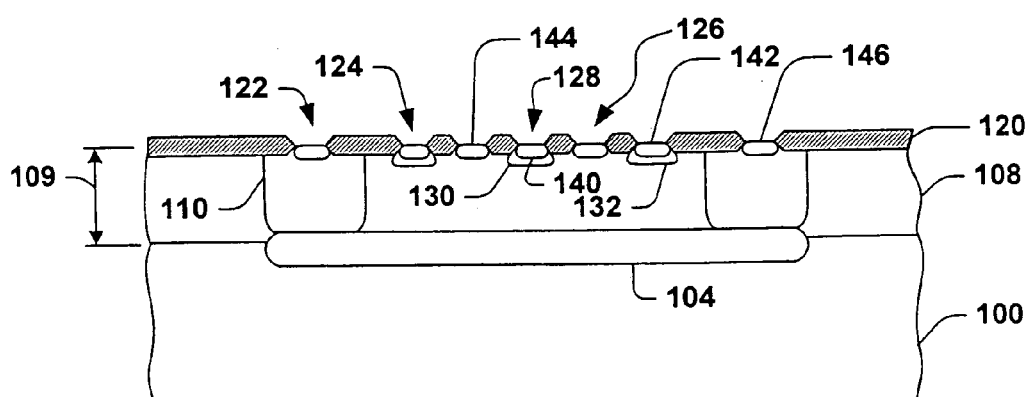
FIG. 11A is a schematic cross-sectional illustration of a JFET formed with VT implants at the source/drain regions in accordance with an aspect of the present invention.

FIG. 11A depicts a JFET in which a suitable dopant has been introduced to define drain 140 and source 142 regions, such as a p-type dopant for a P-JFET and a n-type dopant for a N-JFET. The drain and source regions are formed over respective VT implants 130 and 132, such as described with respect to FIG. 10A. Tight critical dimension control of the drain and source regions 140 and 142 is facilitated because of the well-defined spaces provided by the field oxide level 120 and associated moat regions. That is, the source/drain implants are substantially aligned to the moat edges because of the field oxide 120, which operates as a hard mask during their implantation. As a result, better critical dimension control can be achieved than with conventional JFET formation and, thus device dimensions can be further reduced without compromising performance.

For the example of a P-JFET, the source and drain regions 132 and 130, for example, can be formed by introducing a high concentration of a suitable p-type dopant through the mask and openings in the field oxide 120, such as for the formation of P-JFET. The implantation of the p-type dopant can occur concurrently with the PSD implants for a p-type MOSFET during a CMOS process. In this example, the drain region 140 and source region 142 are formed in conjunction with associated VT implants 130 and 132, respectively, which operate to extend the source/drain junctions deeper in the p-type epitaxial layer 108. For the example of a P-JFET, the VT implants 130 and 132 can be VTN implants.

Also depicted in FIG. 11A are a gate region 144 and backgate 146 formed in the respective moat regions 126 and 122. The gate regions 144 and 146 are formed by introducing an appropriate dopant, such as a n-type dopant for a P-JFET or p-type dopant for a N-JFET. By way of particular example, the gate and backgate regions 144 and 146 can be formed by implanting a dose of phosphorus (e.g., $P_{31}$) of approximately 4 $E^{14}$ atoms/cm$^2$ at about 50 KeV, which can be followed with a dose of arsenic (As) of about 3 $E^{15}$ atoms/cm$^2$ at about 120 KeV. This can correspond to NSD implants in a CMOS or Bi-CMOS process. As noted above with respect to the source drain regions 140 and 142, the distances between the respective gate and source and drain are dictated by the mask used to form the respective moat regions 124 to 128 in the field oxide layer 120. Consequently, the JFET can achieve improved critical dimension control and, by borrowing steps from an associated CMOS and/or Bi-CMOS process, it can be implemented for very little additional cost.

Figure 11B:
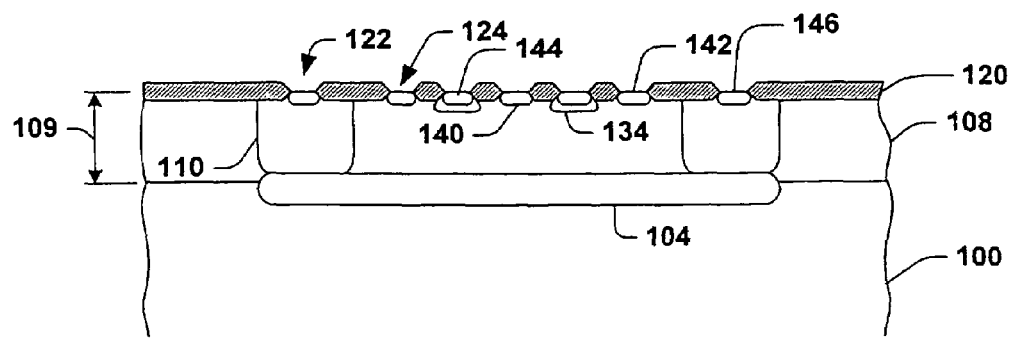
FIG. 11B is a schematic cross-sectional illustration of a JFET formed with VT implants at the gate region in accordance with an aspect of the present invention.

FIG. 11B depicts an alternative example of JFET having respective gate, backgate, source and drain regions 144, 146, 142 and 140. Additionally, VT implants 134 have been introduced at the moat region 126 associate with the gate region 144. For the example of a P-JFET, VTP implant can be utilized in the n-type gate region 144. The VTP implants tend to push carriers away from damaged regions caused by n-type implants (e.g., NSD implants for NMOS) used to form the gate 144. The combination of NSD implants and VTP implants to form the gate region also reduces the drive current for the JFET.

Figure 11C:
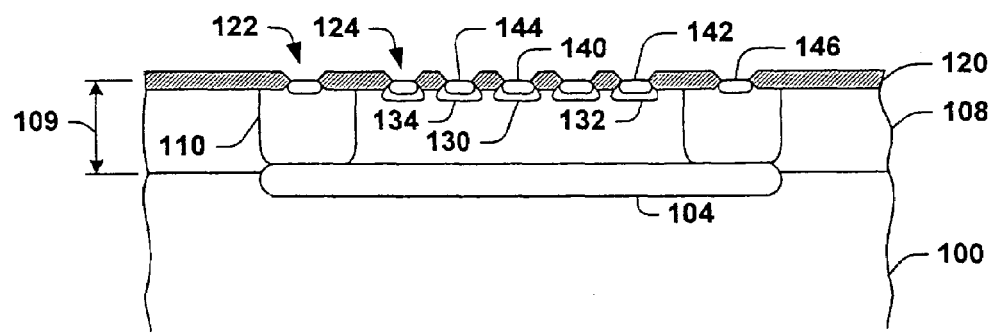
FIG. 11C is a schematic cross-sectional illustration of JFET formed with VT implants at the gate, source and drain regions in accordance with an aspect of the present invention.

FIG. 11C illustrates an example of a JFET device having VT implants 130, 132, and 134 in combination with respective drain, source and gate regions 140, 142 and 144. In a P-JFET, for example, VTN implants can be introduced at the drain and source regions 140 and 142, which can be implanted concurrently with VTN implants in a CMOS process, such as described above with respect to FIG. 10B. Similarly, the VTP implants applied to the gate region 144 can be introduced concurrently with VTP implants in an associated CMOS process. VTP and VTN implants can be implemented with materials and at doses similar to those identified above with respect to FIGS. 10A-10D.

Figure 11D:
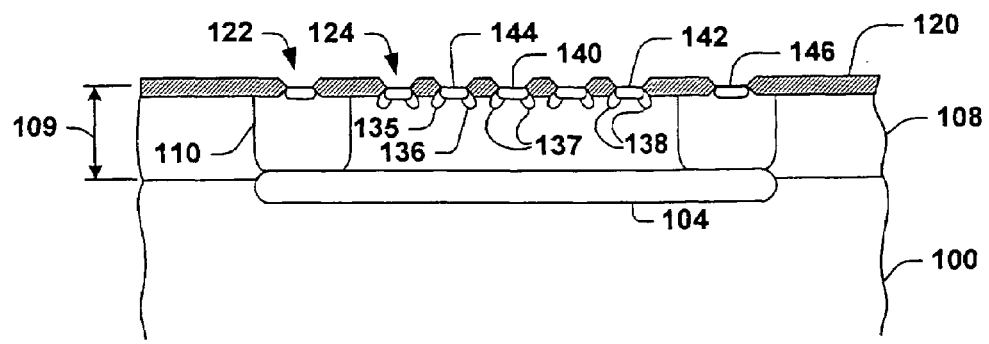
FIG. 11D is a schematic cross-sectional illustration of JFET formed with partial VT implants in accordance with an aspect of the present invention.

FIG. 11D depicts a JFET device in which partial VT implants 135 and 136 of one type have been provided at the gate region 144 and partial VT implants of another type have been provided at drain and source regions 140 and 142. In this example, the partial implants 135, 136, 137 and 138 result in axially spaced apart extensions into the epitaxial layer 108 at each of the respective gate, drain and source regions 144, 140 and 142. As described herein, the partial VT implants 137 and 138 result in extending or deepening the respective junctions at the source/drain regions. The VT implants 135 and 136 at the gate help push carriers away from damaged regions. The partial implants 135, 136, 137 and 138 further mitigate noise in the drain current. Those skilled in the art will further appreciate that the mask structure employed to implant the partial VT implants can be modified to control the amount of implants at each region so as to improve noise characteristics and performance for a given application. For example, the amount and location of one or both partial VT implants 135 and 136 at the gate region 144 can be adjusted for subsequent processes based on noise performance in the JFETs, such as implemented as part of a closed loop system to optimize JFET performance.

Figure 12:
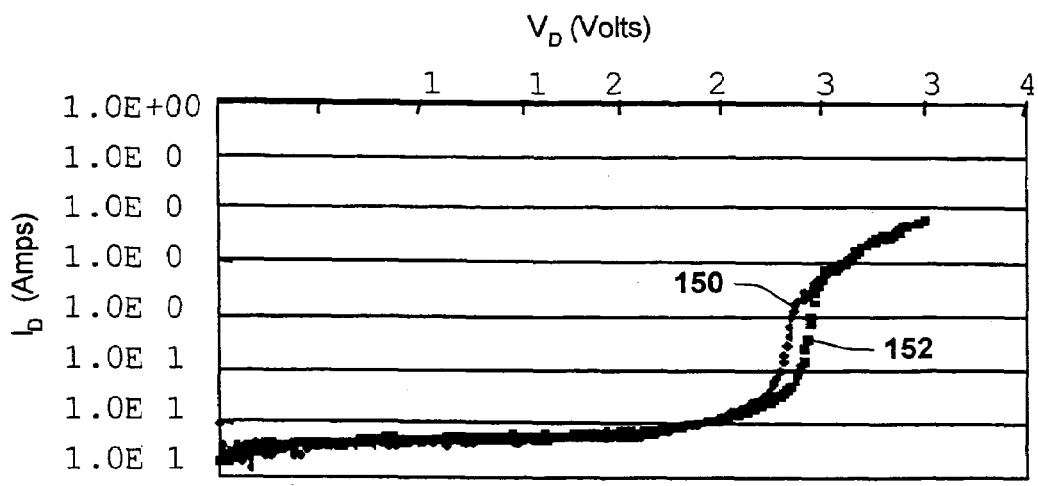
FIG. 12 is a graph depicting breakdown voltage characteristics for first and second sweeps with a JFET in accordance with an aspect of the present invention.

FIG. 12 depicts a graph illustrating breakdown voltage characteristics over implemented with a P-JFET according to an aspect of the present invention. As shown in FIG. 12, plots 150 and 152 represent breakdown voltage characteristics as drain current ($I_D$) as a function of drain voltage ($V_D$) for two separate sweeps with the JFET. The plots 150 and 152 in FIG. 12 represent a P-JFET having VTP and NSD implants utilized as the gate. Those skilled in the art will appreciate that the JFET exhibits lower hysteresis effects (e.g., commonly referred to as "walking") between the two sweeps represented as plots 150 and 152. This property results from employing a good field oxide layer between active regions of the JFET, which mitigates charge build up at the gate/channel (e.g., N+ gate/P-channel) region of the JFET, such as during PN junction breakdown. Additionally, the JFET is capable of higher voltage applications (e.g., >20 V) than many conventional JFET structures due to the thickness of its epitaxial layer and low doping level used to form the channel region thereof.

Figure 13:
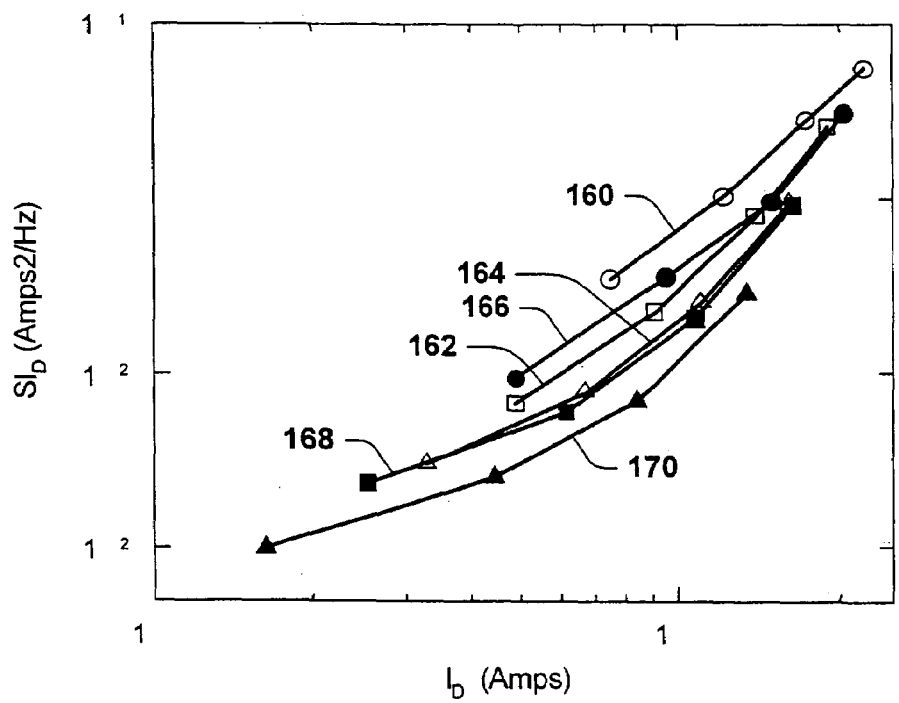
FIG. 13 is a graph depicting a comparison of noise characteristics for different JFETs in accordance with an aspect of the present invention.

FIG. 13 illustrates a comparative example of noise characteristics ($SI_D$) for a P-JFET with VTP implants at the gate and a P-JFET without VTP implants at the gate. It will be appreciated that the addition of VTP implant at the gate helps push the carriers to compensate for damage caused by the n-type implants introduced to form the gate region. In FIG. 13, the noise characteristics are shown for three different operating conditions of two example P-JFET devices under the same voltage bias conditions.

By way of example, plots 160, 162, and 164 correspond to a P-JFET having a gate formed of a n-type dopant with no VTP implant. The other curves 166, 168, and 170 correspond to a similarly configured P-JFET under the same operating conditions as respective curves 160, 162, and 164, but in which the P-JFET has n-type dopant and a VTP implant as the gate. The curves 160-170 represent the noise characteristics ($SI_D$) plot as a function of drain current ($I_D$). As shown in FIG. 13, the JFET that includes the VTP implant has a lower drive current for the given bias voltage conditions, as is evident from a comparison of 160 and 166, 162 and 168, as well as 164 and 170. In addition to the reduced drive current in the device, the noise is also significantly lower on the JFET that includes the VTP implant at the gate.

Figure 14:
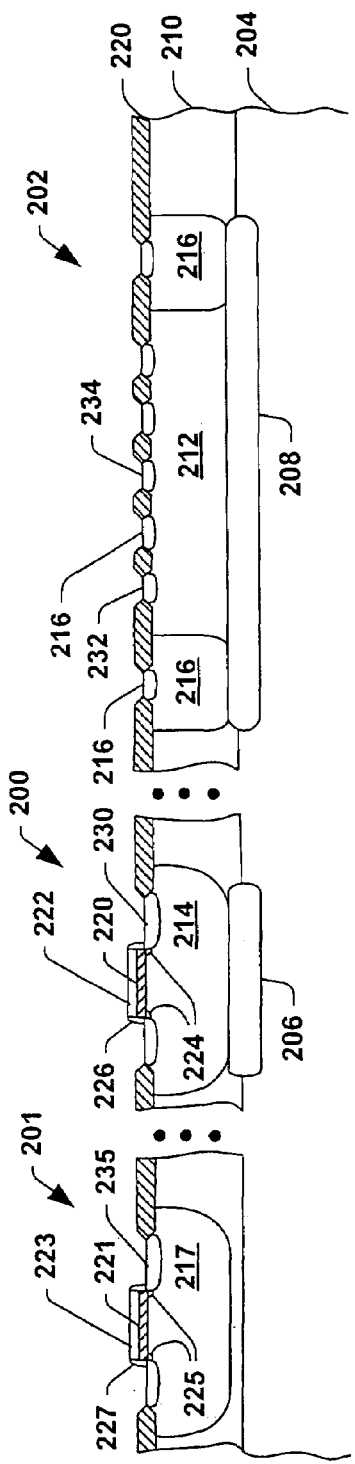
FIG. 14 is a schematic cross-sectional illustration of a JFET device and associated MOSFET devices fabricated in accordance with an aspect of the present invention.

FIG. 14 illustrates examples of a PMOS device 200, NMOS device 201 and a P-JFET device 202, which can be fabricated as an integrated VLSI, in a CMOS or Bi-CMOS process implemented in accordance with an aspect of the present invention. Those skilled in the art will appreciate that no additional process steps are needed to form the P-JFET than those utilized in connection with fabricating the PMOS and NMOS devices 200 and 201. The only difference is that the associated masks are modified to form both types of transistors concurrently in the CMOS process. While the structure in FIG. 14 is described below as a CMOS process, those skilled in the art will appreciate that such structure also could be fabricated in a Bi-CMOS process according to an aspect of the present invention.

In this example, the devices 200, 201 and 202 are fabricated on a silicon substrate 204. Additionally, n-type buried layers 206 and 208 are patterned and implanted into the substrate 204. Optionally, a p-type buried layer (not shown) can be provided at the NMOS device 201. The buried layer 206 reduces substrate resistance in the PMOS device 200 and buried layer 208 forms the back (or bottom) gate of the JFET 202. An epitaxial layer 210 is grown over the buried layers 206 and 208 and the substrate 204. In this example, the p-type epitaxial layer forms the JFET channel region 212. Alternatively, the JFET buried layer 208 could be fabricated with a buried layer of a bipolar device.

N-well formation occurs concurrently, for example, to form the channel region 214 of the PMOS device 200, as well as to provide an N-well 216 of the JFET 202. The N-wells 214 and 216 are formed by patterning a resist layer (typically over an oxide layer) and then implanting desired high-energy positive dopant ions (e.g., phosphorous, arsenic or antimony) into exposed portions of the epitaxial layer 210. Annealing also may be employed, such as to cause the dopants to diffuse further into the epitaxial layer 210 and electrically activate the dopants by causing the dopants to become part of the crystal lattice structure. The N-well 216 electrically connects with the bottom gate provided by the buried layer 208 and surrounds the other parts of the JFET structure to provide isolation from adjacent structures. Those skilled in the art will understand and appreciate that a P-well 217 for formation of the NMOS device 201 can occur concurrently with the isolation region of an N-JFET device. Alternatively, P-well formation can occur at an alternative step relative to the N-well formation described above.

A field oxide layer 220 is formed by selectively patterning and etching a nitride layer that has been deposited over an oxide layer, such as by a high-temperature, low pressure chemical vapor deposition (LPCVD). Selective patterning and etching (e.g. with photoresist) opens desired isolation regions in the nitride, oxide to the epitaxial layer 210 according to the field oxide mask. Spaces located between the openings define respective moat regions for each of the respective devices 200 or 202. The desired thick field oxide layer can be formed by high temperature oxidation in furnace, for example. After the nitride layer has been stripped, VTN and/or VTP implants can then be provided in the active regions, such as described herein (not shown).

While no additional process steps are required to form the JFET 202, some process steps for fabricating the PMOS device 200 and the NMOS device 201 may be required apart from those mentioned above for concurrent JFET and PMOS fabrication. For example, gate oxide layers 220 and 221 can be formed by a suitable thermal oxidation step and the like. After depositing a layer of polysilicon, polysilicon gates 222 and 223 can be defined and etched for the respective devices 200 and 201. The gate oxide 220 and 221 and etched polysilicon layers 222 and 223 define a polysilicon gate of the MOS devices 200 and 201. Lightly doped drain (LDD) regions 224 and 225 are formed having a shallow junction depth. For example, the LDD region 224 can be formed by implanting a suitable p-type implant (e.g., $BF_2$ or B) at a low energy level. The LDD region 225 is formed by implanted a suitable n-type implant (e.g., As or P). Sidewall spacers 226 and 227 also can be formed around the polysilicon gates to mitigate subsequent source/drain implants from penetrating too close to the channel. Formation of the sidewall spacers 226 and 227 generally entails deposition of a spacer oxide (or nitride) material and etching (e.g., by dry plasma etching) the oxide so as to leave behind the thicker oxide on the sidewalls of the polysilicon gate, such as illustrated in FIG. 14.

Source/drain implants can be introduced as part of the CMOS device through appropriately configured masks to concurrently form the gate, source and drain regions of the JFET device 202 according to an aspect of the present invention. The types of dopant materials will depend on the type of MOSFET device being fabricated in a particular process step.

For example, $p^+$ source/drain (PSD) implants are implanted through a photoresist mask to form source and drain regions 230 in the PMOS transistor 200 concurrently with forming the source and drain regions 232 and 234 of the P-JFET (or form gate region of a N-JFET (not shown)). The source/drain implants are introduced to a deeper level than the lightly doped drain implant depth. Similarly, $n^+$ source/drain (NSD) implants are implanted to form source and drain regions 235 in the NMOS device 201 concurrently with forming the gate region in the P-JFET 202 (or to form the source and drain regions for a N-JFET (not shown)). Those skilled in the art will understand and appreciate various n-type and p-type materials that can be utilized to form such structures in a CMOS process, such as described hereinabove. After the gate and source drain regions have been formed, backend connections, including contacts, metalization and vias can be implemented to complete the transistor structures, as is known in the art.

In view of the example described above, in which a JFET 202 is fabricated in a CMOS process concurrently with a MOSFET devices 200 and 201, it will be appreciated that such JFET also could be fabricated in a Bi-CMOS process in accordance with an aspect of the present invention. Additional fabrication efficiencies thus can be achieved by configuring masks and implanting dopants to enable concurrent fabrication of various parts of MOSFET, BJT and JFET devices. Those skilled in the art will appreciate various configurations and materials that can be employed to fabricated MOSFET, BJT and JFET devices according to one or more aspects of the present invention.

Figure 17:
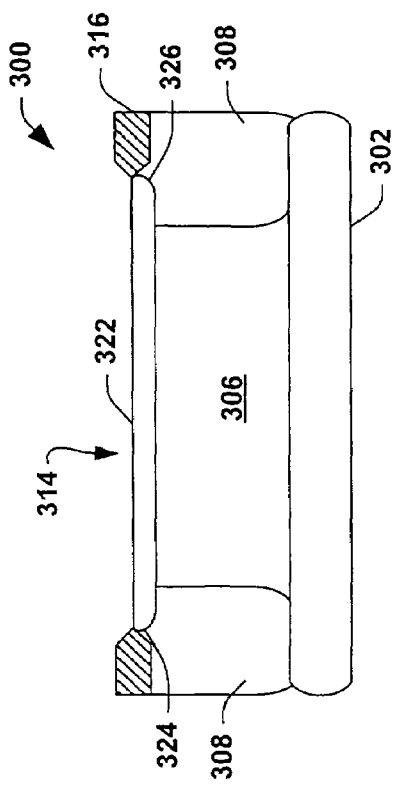
FIG. 17 is a schematic cross-sectional view taken along line 17-17 of FIG. 15 illustrating the JFET device in accordance with an aspect of the present invention.
Figure 15:
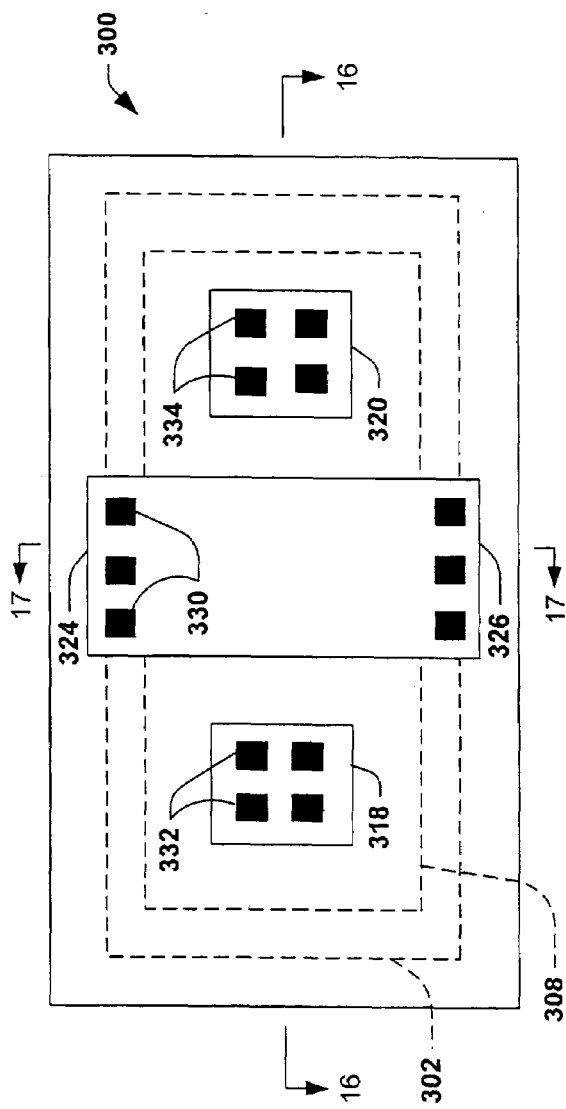
FIG. 15 is a plan view of another configuration of JFET device in accordance with an aspect of the present invention.
Figure 16:
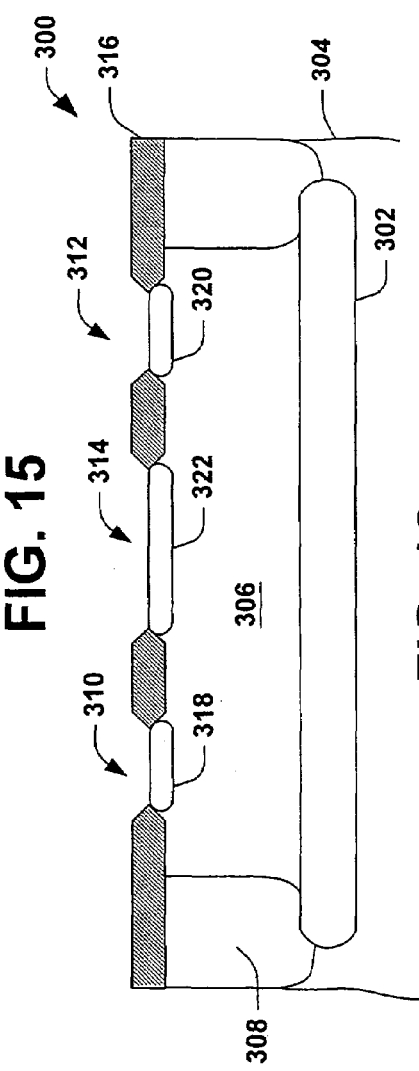
FIG. 16 is a schematic cross-sectional view taken along line 16-16 of FIG. 15 illustrating the JFET device in accordance with an aspect of the present invention.

FIGS. 15-17 illustrate a JFET transistor structure 300 that can be fabricated in accordance with an aspect of the present invention. The JFET structure 300 can be fabricated concurrently with a CMOS process or a Bi-CMOS process, such that no additional process steps are required for implementing the JFET. Alternatively, the JFET structure 300 can be fabricated separately (e.g., partially or completely separate) from other processes to achieve a structure similar to that shown and described in FIGS. 15-17. While the example depicted in FIGS. 15-17 illustrates the JFET 300 as having a generally rectangular box-like configuration, those skilled in the art will understand and appreciate various other shapes and configurations, such as oval, square, circular, which can be implemented in accordance with an aspect of the present invention.

The JFET structure 300 includes a buried layer 302 that is patterned and implanted in the substrate 304. The buried layer 302 defines a bottom gate of the JFET structure 300. The buried layer 302 is heavily doped with suitable dopants depending on the type of JFET, namely a P-JFET or N-JFET. A corresponding buried layer also can be implemented concurrently in a MOSFET or bipolar device, as part of a CMOS or Bi-CMOS process.

A relatively thick epitaxial layer 306 is formed over the buried layer 302. The epitaxial layer 306 will define the channel of the JFET 300. The epitaxial layer can have a thickness greater than 3.0 µm, such as in a range from about 3.0 µm to about 4.0 µm or greater. The epitaxial layer 306 also has a resistivity of about 5.5 to about 8.5 ohm-cm and can be formed as a n-type or p-type materials, depending on the type of substrate 304. The formation of the epitaxial layer 306 can cause out-diffusion at the epitaxial layer/wafer interface in which a portion of the buried layer 302 can diffuse out and become incorporated into a lower portion of the epitaxial layer 306, as depicted in FIG. 16.

An isolation region 308 is formed in the epitaxial layer 306, which surrounds the channel and active regions of the structure 300. The isolation region 308 is formed, for example, by deep ion implantation, such as through an appropriate mask, at an energy level sufficient to connect to the buried layer 302. The isolation region 308 can be formed concurrently with the well formation in a CMOS or Bi-CMOS process (e.g., formation of n-well or p-well regions). As described herein, it will be appreciated that the connection between the isolation region and the buried layer facilitates coupling the gate to the backgate to provide a three terminal JFET device in accordance with an aspect of the present invention.

For the example of a P-JFET, the isolation region 308 is formed by implanting n-type dopants (e.g., phosphorous) concurrently with N-well formation in an associated NMOS or bipolar devices. After implantation of the N-well implant, the structure can be heated in a furnace (e.g., annealing) to facilitate diffusion of the implant into the epitaxial layer 306. Alternatively, p-type dopants can be implanted to form an isolation region in a N-JFET concurrently with p-well formation.

As depicted in FIG. 16, moat regions 310, 312 and 314 are formed with a field oxide layer 316 that is oxidized over the epitaxial layer 306 and associated isolation region 308. The moat regions 310-314 define openings through which the source, drain and gate regions 318, 320 and 322 are formed. Those skilled in the art will thus appreciate that the moat regions 310-314 can be provided in substantially any desired shape by appropriate patterning and etching with a field oxide mask.

The field oxide layer 316 isolates active regions from each other, which are located at the moat regions 310, 312 and 314. The field oxide layer 316 provides a relatively thick layer e.g., having thickness ≧about 2000 Å (e.g., typically between about 2500 Å and about 15000 Å). The field oxide layer 316 helps inhibit electrical charge build up near the surface layers of the JFET during PN junction breakdown. The field oxide that surrounds the moat regions 310, 312, and 314 thus operates to mitigate walking in the breakdown voltage that tends to occur in other JFET structures due to charge build up.

Source and drain regions 318 and 320 are formed by implantation of a suitable type of dopant. The particular dopants and their concentration will vary according to the type of JFET device being fabricated and application requirements. As shown in FIGS. 15-17, the source and drain regions 318 and 320 correspond to spaced apart generally island-like formations surround by the field oxide 316. Those skilled in the art will appreciate that while the source and drain regions are illustrated as having rectangular or square configurations, any desired shape can be utilized for such regions by patterning and etching an implant mask accordingly. Additionally, tighter critical dimension control can be achieved because of the masking function provided by the field oxide layer 316, which helps align edges of the active regions.

According to one aspect of the present invention, the source and drain regions 318 and 320 can be formed concurrently with implanting source/drain implants of a MOSFET device during a CMOS or Bi-CMOS process. That is, the same masking and implanting processes can be utilized for introducing the implants in the JFET and MOSFET devices. For example, in the fabrication of a P-JFET, the source and drain regions 318 and 320 can be formed with PSD implants in CMOS or Bi-CMOS process. By way of particular example, the PSD implant can be provided with a does of $BF_2$ of about $2 E^{15}$ at 80 KeV, such that the source and drain regions 318 and 320 thus define PMOAT regions in the JFET device 300.

The gate region 322 also is formed by implanting suitable dopants into the moat region 314. For example, patterning and etching of a photoresist can be utilized to define gate region in which the gate implant is to be introduced. It is to be understood and appreciated that the patterning, etching and implantation can occur concurrently formation of a source/drain implant for a CMOS device having different types of implants than regions 318 and 320. For example, the NSD implants can be applied into the moat region 314 as one or more n-type implants (N+ implant) at a medium energy level that penetrates the epitaxial layer 306 to a desired depth. Arsenic, antimony and/or phosphorous can be utilized as an NSD implant in a CMOS process for the gate region 322. By way of further example, the NSD implant can be implemented with phosphorous ($P_{31}$) of $2 E^{15}$ at 50 KeV, which can be followed by arsenic (As) of $3 E^{15}$ at 120 KeV.

As described herein, the formation of the source and drain regions 318 and 320 as well as the gate region 322 can be preceded by appropriate VT implants (not shown) at one or more of the moat regions. The VT implants can be provided at the entire moat region or, alternatively, the partial VT implants could be selectively provided through a corresponding implant mask to less than the entire moat region, such as described herein. For example, a partial VTP implant could be provided at the moat region 314 proximal the source-end and/or the drain-end thereof.

As perhaps best shown in FIG. 17, the gate region 322 is formed to have spaced apart lateral end portions 324 and 326 that integrally connect with the isolation region 308. While the particular gate region 322 is depicted as having both end portions 324 and 326 connecting with the isolation region 308, the JFET 300 also could be implemented as having only one of the end portions connected with the isolation region in accordance with an aspect of the present invention. Such a configuration thus forms a permanent connection between the gate region 322 and the buried layer 302 through the isolation region 308, thus coupling the gate and the backgate of the JFET 300. As a result, a three terminal device is provided without requiring additional formation of interconnects (e.g., by metallization) between the gate and backgate.

After the respective gate, source and drain regions 322, 318 and 320 have been formed, suitable contacts 330, 332 and 334 can be formed on all active areas (e.g., moat regions 310, 312, and 314) of the JFET device 300. Those skilled in the art will understand and appreciate various types of material that can be utilized to form metal contacts including, for example, aluminum or copper metallization schemes.

What has been described above includes examples depicting how the present invention might be implemented. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A Junction Field Effect Transistor (JFET), comprising:
a buried layer that defines a backgate;
an epitaxial layer over the buried layer;
a doped isolation region in the epitaxial layer and connecting with the buried layer;
a gate region interposed between source and drain regions, the doped isolation region surrounding the gate, source and drain regions, the gate region, the buried layer, and the doped isolation region being formed to have one of a n-type and a p-type dopant
oxide isolation regions located at least partially in the epitaxial layer and between the gate region and the source and drain regions and
a threshold voltage implant region associated with at least one of the gate region, the source region, and the drain region, the threshold voltage implant region comprising one of a NMOS threshold voltage (VTN) implant and a PMOS threshold voltage (VTP) implant selected according to the respective type of dopants used to form the associated at least one of the gate region, the source region and the drain region.

2. The transistor of claim 1, the gate region integrally connected with the doped isolation region to provide a connection between the gate region and a backgate region of the JFET.

3. The transistor of claim 2, the gate region of the JFET having spaced apart end portions that connect with substantially opposed side edges of the doped isolation region, such that the gate region is interposed between the source and drain regions of the JFET.

4. The transistor of claim 1, the epitaxial layer having a thickness sufficient to provide the JFET with a breakdown voltage that is greater than about 20 volts.

5. The transistor of claim 4, the epitaxial layer having a thickness greater than about 3 μm.

6. The transistor of claim 1, the threshold voltage implant region being associated with the gate region only as one of a VTN implant and a VTP implant depending on the type of dopant used to form the gate region.

7. The transistor of claim 1, the threshold voltage implant region being associated with the source and drain regions only as one of a VTN implant and a VTP implant depending on the type of dopant used to for the source and drain regions.

8. The transistor of claim 1, the threshold voltage implant region further comprising:
- a first implant region associated with the gate region and having one of VTN implants and VTP implants; and
- second and third implant regions associated with the respective source and drain regions, each having one of VTP implants and VTN implants different from the first implant region.

9. The transistor of claim 1, the threshold voltage implant region further comprising partial threshold voltage implants associated with the at least one of the gate region, the source region and the drain region, the partial threshold voltage implants occupying a selected portion of the threshold voltage implant region.

10. A three terminal Junction Field Effect transistor (JFET), comprising:
- a buried layer that defines a backgate region;
- an epitaxial layer disposed over the buried layer;
- a doped isolation region in the epitaxial layer that connects with the buried layer;
- a gate region integrally connected with the doped isolation region to provide a connection between the gate region and the backgate region;
- source and drain regions formed of one of an n-type and a p-type dopant that is different from the type of dopant that forms the gate region, the gate region being interposed between the source and drain regions, the isolation region providing a well that substantially surrounds the gate, source and drain regions; and
- an oxide isolation region located at least partially within the epitaxial layer and between the gate region and each of the source and drain regions.

11. The JFET of claim 10, further comprising a threshold voltage implant region associated with at least one of the gate, source and drain regions, the threshold voltage implant region comprising one of a NMOS threshold voltage (VTN) implant and a PMOS threshold voltage (VTP) implant selected according to the respective type of dopant used to form the respective at least one of the gate, source and drain regions associated with the threshold voltage implant region.

12. The transistor of claim 11, the threshold voltage implant region being associated with the gate region only and further comprising one of n-type threshold voltage implants and p-type threshold voltage implants.

13. The transistor of claim 11, the threshold voltage implant region being associated with the source and drain regions only and further comprising one of VTN and VTP implants.

14. The transistor of claim 11, the threshold voltage implant region further comprising a partial threshold voltage implant region having one of VTN implants and VTP implants provided at a selected portion of the threshold voltage implant region.

15. The transistor of claim 10, the epitaxial layer having a thickness sufficient to provide the JFET with a breakdown voltage that is greater than about 20 volts.

16. The transistor of claim 15, the epitaxial layer having a thickness greater than about 3 μm.

* * * * *